(12) United States Patent
Petrie

(10) Patent No.: US 10,705,560 B1
(45) Date of Patent: Jul. 7, 2020

(54) SIGNAL PATH BLANKING DURING COMMON MODE INPUT TRANSITIONS

(71) Applicant: Allegro MicroSystems, LLC, Manchester, NH (US)

(72) Inventor: Craig S. Petrie, Merrimack, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/511,104

(22) Filed: Jul. 15, 2019

Related U.S. Application Data

(63) Continuation-in-part of application No. 16/365,855, filed on Mar. 27, 2019.

(51) Int. Cl.
  *G06F 1/08* (2006.01)
  *H03C 3/09* (2006.01)
  *H03L 7/07* (2006.01)

(52) U.S. Cl.
  CPC .............. *G06F 1/08* (2013.01); *H03C 3/0966* (2013.01); *H03L 7/07* (2013.01)

(58) Field of Classification Search
  CPC ............ G06F 1/08; H03C 3/0966; H03L 7/07
  USPC ................................................. 327/291, 564
  See application file for complete search history.

(56) References Cited

U.S. PATENT DOCUMENTS

| | | | |
|---|---|---|---|
| 5,517,112 A | 5/1996 | Vig et al. | |
| 5,537,650 A * | 7/1996 | West | G06F 1/3218 |
| | | | 713/324 |
| 6,091,987 A * | 7/2000 | Thompson | A61N 1/362 |
| | | | 607/2 |
| 7,369,969 B2 | 5/2008 | Scherr | |
| 7,602,386 B2 * | 10/2009 | Maekawa | G09G 3/3696 |
| | | | 327/115 |
| 8,138,750 B2 | 3/2012 | Fink et al. | |
| 9,318,481 B1 | 4/2016 | Wang et al. | |
| 9,347,998 B2 | 5/2016 | Szczeszynski | |
| 9,935,452 B2 | 4/2018 | Looby et al. | |
| 10,003,306 B1 * | 6/2018 | Larson | H03F 1/26 |
| 10,084,407 B2 | 9/2018 | Looby et al. | |
| 2008/0018769 A1 * | 1/2008 | Hatano | H04N 5/357 |
| | | | 348/312 |
| 2018/0367073 A1 | 12/2018 | Haas | |
| 2019/0170832 A1 | 6/2019 | Kravljaca et al. | |
| 2019/0339985 A1 | 11/2019 | Cook et al. | |
| 2020/0021212 A1 | 1/2020 | Yamada et al. | |
| 2020/0028456 A1 | 1/2020 | Morioka et al. | |

OTHER PUBLICATIONS

U.S. Appl. No. 16/365,855, filed Mar. 27, 2019, Daubert et al.

* cited by examiner

*Primary Examiner* — William Hernandez
(74) *Attorney, Agent, or Firm* — Daly, Crowley, Mofford & Durkee, LLP

(57) ABSTRACT

A sensor includes an analog front end having a circuit element responsive to a clock signal and a clock generating circuit configured to generate the clock signal having blanking time periods during which the clock signal is held at a constant level, wherein the circuit element is not operational during the blanking time periods. The blanking time periods correspond to time periods during which transitions of a common mode input voltage to the sensor are expected to occur.

18 Claims, 8 Drawing Sheets

US 10,705,560 B1

SIGNAL PATH BLANKING DURING COMMON MODE INPUT TRANSITIONS

CROSS-REFERENCE TO RELATED APPLICATIONS

This application is a Continuation-in-Part (CIP) application of and claims the benefit of and priority to U.S. patent application Ser. No. 16/365,855, filed on Mar. 27, 2019, which application is incorporated by reference herein in its entirety.

STATEMENT REGARDING FEDERALLY SPONSORED RESEARCH

Not Applicable.

FIELD

This disclosure relates generally to integrated circuits (ICs) and more particularly such ICs including blanking during common mode input transitions.

BACKGROUND

Current sensor integrated circuits (ICs) are used in a wide variety of applications including motors, in which current through one or more motor windings is measured by measuring a voltage across a sense resistor coupled in series or "in-line" with the motor winding. Such current sensor ICs generate an analog or digital output signal indicative of the motor phase current as may be used in controlling motor position and speed.

In-line current sensing in a motor application and other applications can be complicated by relatively large common mode voltages experienced by the sense resistor and thus also by the circuitry coupled to detect the current through the sense resistor. For example, the voltage across the sense resistor can swing between ground and a high input supply voltage level. Further, because of the inductive nature of motor windings, the resistor voltage can in fact swing beyond the supply voltage range.

Various techniques are used to electrically isolate sense circuitry from sensed elements subjected to large common mode voltages. For example, in some arrangements, a multi-chip solution entails the use of multiple integrated circuits to isolate the sense circuitry from large common mode voltages.

SUMMARY

According to the disclosure, a sensor include an analog front end having a circuit element responsive to a clock signal and a clock generating circuit configured to generate the clock signal having blanking time periods during which the clock signal is held at a constant level, wherein the circuit element is not operational during the blanking time periods. In embodiments, the blanking time periods correspond to time periods during which transitions of a common mode input voltage to the sensor are expected to occur.

The sensor may include one or more of the following features, alone or in combination. The sensor may include a current sensor integrated circuit to sense a current through a resistor and the circuit element may include an amplifier having inputs coupled across the resistor. The circuit element of the analog front end may include a sample-and-hold circuit. The analog front end may further include an analog-to-digital converter coupled to an output of the amplifier to generate a digital signal having a value indicative of the current through the resistor. The sensor may further include an output isolator coupled between the analog-to-digital converter and a digital processor, wherein the digital processor is configured to generate a sensor output signal indicative of the current through the resistor. The sensor may further include an input isolator coupled between the digital processor and the analog front end and configured to transmit the clock signal from the digital processor to the analog front end for synchronization and use by the analog-to-digital converter. The current sensor integrated circuit may include a substrate, a tub disposed in the substrate, and a charging circuit configured to bias the analog front end and the tub to a bias voltage that is a predetermined offset voltage greater than a common mode voltage associated with the resistor. The common mode voltage associated with the resistor can be coupled to the analog front end and to the tub as a reference potential. The analog front end may further include a regulator configured to power the amplifier and coupled to receive the bias voltage as a regulator supply input voltage.

According to a further aspect, a method includes providing a sensor with an analog front end having a circuit element responsive to a clock and generating the clock signal having blanking time periods during which the clock signal is held at a constant level, wherein the circuit element is not operational during the blanking time periods. The blanking time periods may correspond to time periods during which transitions of a common mode input voltage to the sensor are expected to occur.

The method may include one or more of the following features, alone or in combination. providing the sensor comprises providing a current sensor integrated circuit to sense a current through a resistor and wherein the circuit element comprises an amplifier having inputs coupled across the resistor. Providing the analog front end may include providing an analog-to-digital converter coupled to an output of the amplifier to generate a digital signal having a value indicative of the current through the resistor. The method may further include providing an output isolator coupled between the analog-to-digital converter and a digital processor, wherein the digital processor generates a sensor output signal indicative of the current through the resistor. The method may further include providing an input isolator coupled between the digital processor and the analog front end, wherein the input isolator transmits the clock signal from the digital processor to the analog front end for synchronization and use by the analog-to-digital converter.

Also described is a sensor including an analog front end comprising a circuit element responsive to a clock signal and means for generating the clock signal having blanking time periods during which the clock signal is held at a constant level, wherein the circuit element is not operational during the blanking time periods. The blanking time periods can correspond to time periods during which transitions of a common mode input voltage to the sensor are expected to occur.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments.

Accordingly, the figures are not intended to limit the scope of the broad concepts, systems and techniques described herein. Like numbers in the figures denote like elements.

DETAILED DESCRIPTION

Figure 1:
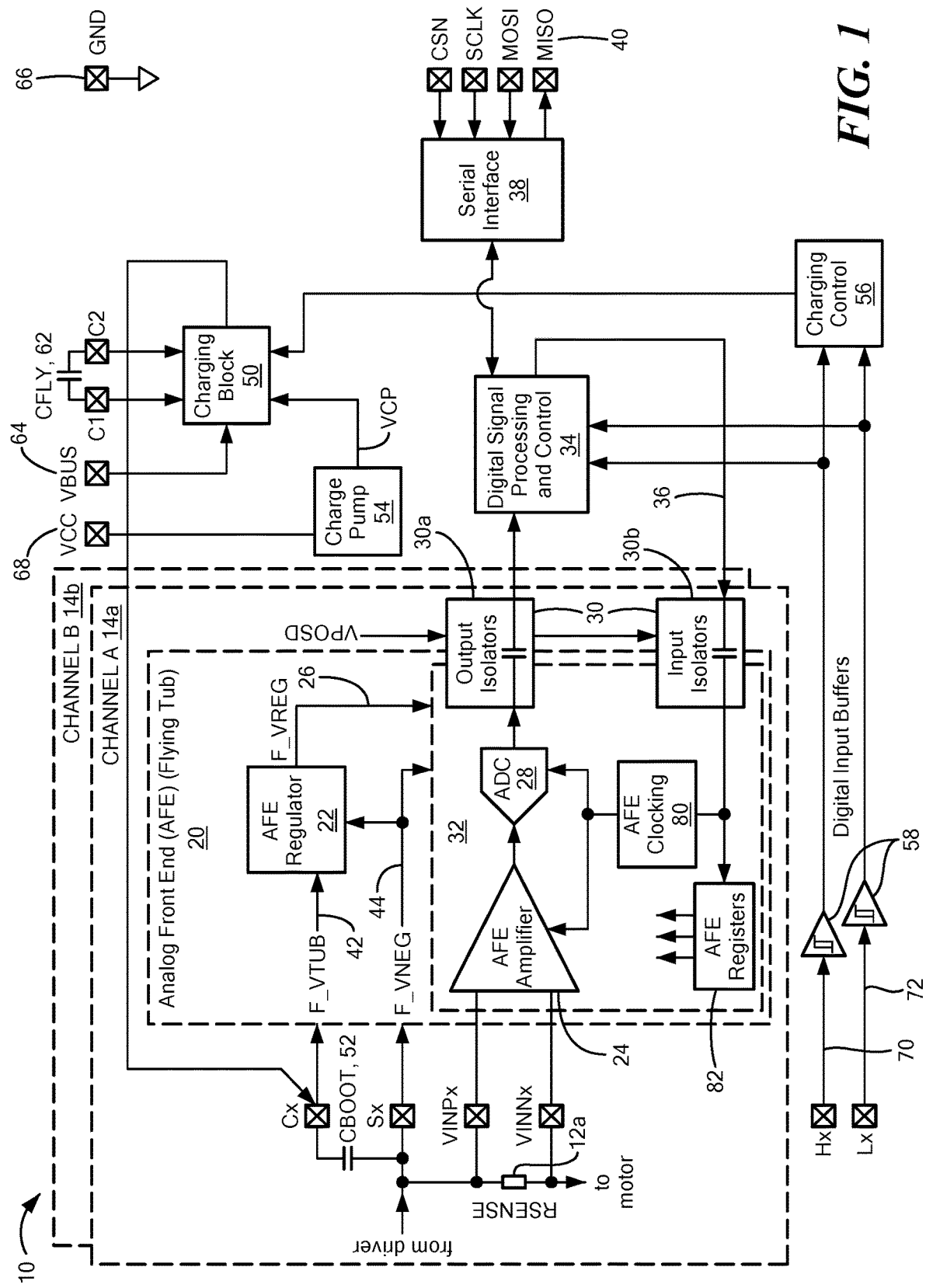
FIG. 1 is a block diagram of a current sensor IC including an analog front end and tub biased to achieve common mode rejection.

Referring to FIG. 1, a current sensor integrated circuit (IC) 10 is coupled to a resistor 12a to sense a current through the resistor. The current sensor 10 has an analog front end 20 that includes a signal path 32 and a regulator 22. The signal path 32 includes an amplifier 24 having inputs coupled across the sense resistor 12a and an analog-to-digital converter (ADC) 28 coupled to an output of the amplifier 24 to generate a digital signal having a value indicative of the voltage across, and thus also the current through, the resistor 12a.

Digital portions of the current sensor IC 10, including a digital processor 34, are coupled to the analog front end 20 through level-translating isolators 30 including output and input isolators 30a, 30b, respectively. Isolators 30 permit bidirectional communication between the analog front end 20 and low voltage digital circuitry. The isolators 30 can take various forms, including but not limited to differential capacitive isolators.

An analog front end (AFE) clock circuit 80 and AFE registers 82 form part of the analog front end 20 and are responsive to a clock signal 36 from the digital processor 34. With this arrangement, the analog front end clock is synchronized with the processor clock. Registers 82 can store configuration bits as may be used for various functions such as trimming a reference voltage.

Digital processor 34 is configured to generate one or more signals indicative of the current through the resistor 12a. An interface 38 is coupled to the digital processor 34 and operates to generate one or more sensor output signals 40 in a desired format, including but not limited to a SPI format, a SENT format, or an I²C format, for communication of the sensed current to external circuits and systems. Depending on the format, additional signal lines can include inputs to the interface 38, as shown for the example SPI interface.

In some applications for the current sensor IC 10, the sense resistor 12a can experience significant common mode voltages. For example, referring also to the example motor control system application shown in FIG. 2, the resistor 12a can be coupled in series with a motor winding and current sensor IC 10 can be thus, configured to sense a motor phase current. More particularly, a motor control system 200 includes a motor 204 as may be a three-phase brushless motor as one example, containing a plurality of windings, each coupled to a driver 208. In this example, two of three motor windings are coupled to the driver 208 through a respective sense resistor 12a, 12b. The sense resistors 12a, 12b can be coupled to the current sensor IC 10 (FIG. 1) for sensing the respective phase current. To this end, the current sensor IC 10 may include multiple channels (e.g., channel A 14a and channel B 14b in FIG. 1), each having connections VINPx, VINNx coupled across a respective sense resistor 12a, 12b, as shown for sense resistor 12a in FIG. 1. Output signals 40 of the current sensor IC 10 can be coupled to a motor controller 220 that is configured to generate motor control signals Hx 70', Lx 72'.

More particularly, driver 208 includes pairs of switches coupled in parallel between a supply voltage VBUS 216 and ground 218. In some automotive applications, the supply voltage VBUS 216 can have a nominal value of +48V. Nodes SA, SB, and SC between each pair of driver switches are coupled to an end of a respective motor coil. The illustrated switches are provided in the form of FETs, each having a gate terminal coupled to receive a control signal from motor control circuit 220, which turns the switches on and off in a preordered sequence in order to selectively couple and decouple each motor winding to and from supply voltage VBUS 216 and ground 218. In this way, motor control circuit 220 provides power to the motor 204. For example, driver switches 210, 212 are coupled together at node SA, which node is coupled to sense resistor 12a. In the context of FIG. 1, node SA is represented by IC connection Sx. The control signals for switches 210, 212 are labeled Hx 70', Lx 72', respectively.

Figure 2:
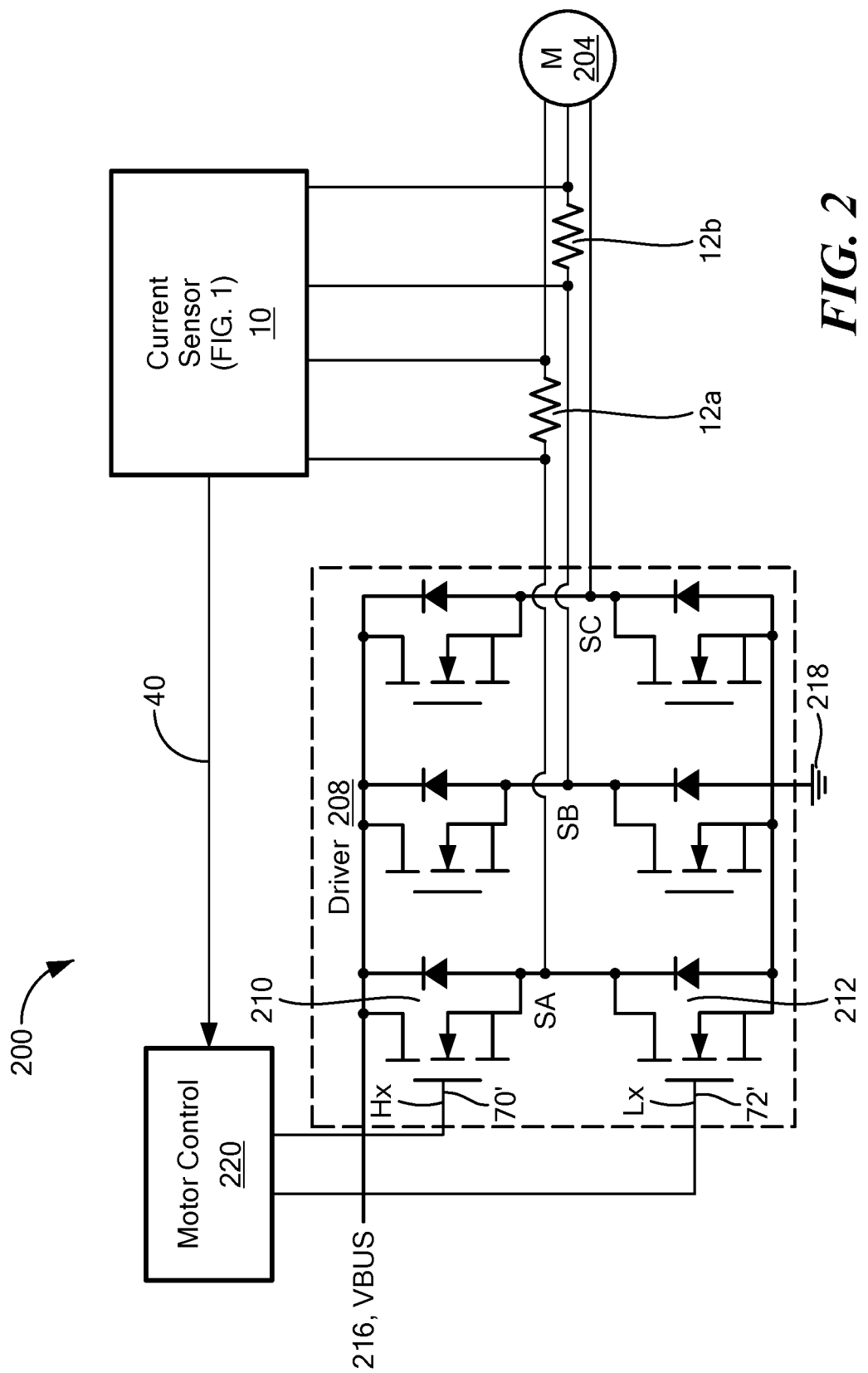
FIG. 2 is a block diagram of an example motor system application for the current sensor IC of FIG. 1.

In the example application of FIG. 2, the common mode voltage associated with each sense resistor 12a, 12b nominally can swing between VBUS 216 and ground 218. However, because of the inductive nature of the motor windings and the rapid transitions of the driver control signals, some undershoot and overshoot can occur. In this arrangement in which the sense resistor's common mode voltage is driven through a large dynamic range, the resistor can be described as "flying" and the common mode voltage range can extend beyond the rails of the IC (i.e., extend beyond the range between the nominal IC supply voltage VCC 68 and ground 218). In an example embodiment in which the VBUS voltage 216 is nominally +48V, the voltage at the sense resistors 12a, 12b can swing from as high as +80V to as low as −16V. Sensing the current through the sense resistors 12a, 12b is complicated by the fact that the differential voltage across the resistors can be on the order of millivolts.

Referring again to FIG. 1, in order to reject the common mode voltage associated with the sense resistor 12a, according to an aspect of the disclosure, the analog front end 20 is biased to a bias voltage F_VTUB 42 that is a predetermined offset voltage greater than a common mode voltage associated with the resistor. For example, the bias voltage F_VTUB 42 can be the first predetermined offset voltage greater than an externally driven common mode voltage as seen at IC connection Sx (referred to herein as common mode voltage Sx).

The current sensor IC 10 receives a supply voltage VCC 68 and can have a reference, or ground connection 66 (that can be the same as the ground connection 218 in the motor system application of FIG. 2). The system voltage VBUS 64 (that can be the same as VBUS 216 in the motor system application of FIG. 2) can provide a reference voltage for the sensor IC 10. The current sensor IC 10 can further receive control signals Hx 70, Lx 72 (as may be the same as or similar to the signals Hx 70', Lx 72' provided by the motor controller 220 to control driver switches 210, 212, respectively, in the motor system application of FIG. 2) for use in generating the bias voltage F_VTUB 42 as will be explained. The signals Hx 70, Lx 72 can be logically equivalent to motor control signals Hx 70', Lx 72' but may have different voltage levels. For example, the motor control signals Hx 70', Lx 72' may be amplified and level-shifted versions of control signals Hx 70, Lx 72 (FIG. 1) to permit the motor driver FETs to be properly turned on and off.

The analog front end 20 includes a regulator 22 coupled to an IC connection Cx to receive the bias voltage F_VTUB 42 as a positive supply voltage input and to IC connection Sx (which is the externally driven resistor common mode voltage) to receive a F_VNEG reference voltage 44 as a negative supply voltage input. The regulator 22 is configured to generate a regulated voltage F_VREG 26 to power the amplifier 24 and other circuitry of the signal path 32. In one example embodiment, the nominal regulated voltage F_VREG 26 can be 3.3 volts. With this arrangement, the amplifier 24 is powered by the F_VREG voltage 26 referenced to the negative supply voltage input F_VNEG 44 (which F_VNEG voltage 44 is also the resistor common mode voltage at connection Sx), thereby rejecting common mode voltage in the differential measurement of the voltage across the resistor 12a.

Figure 3:
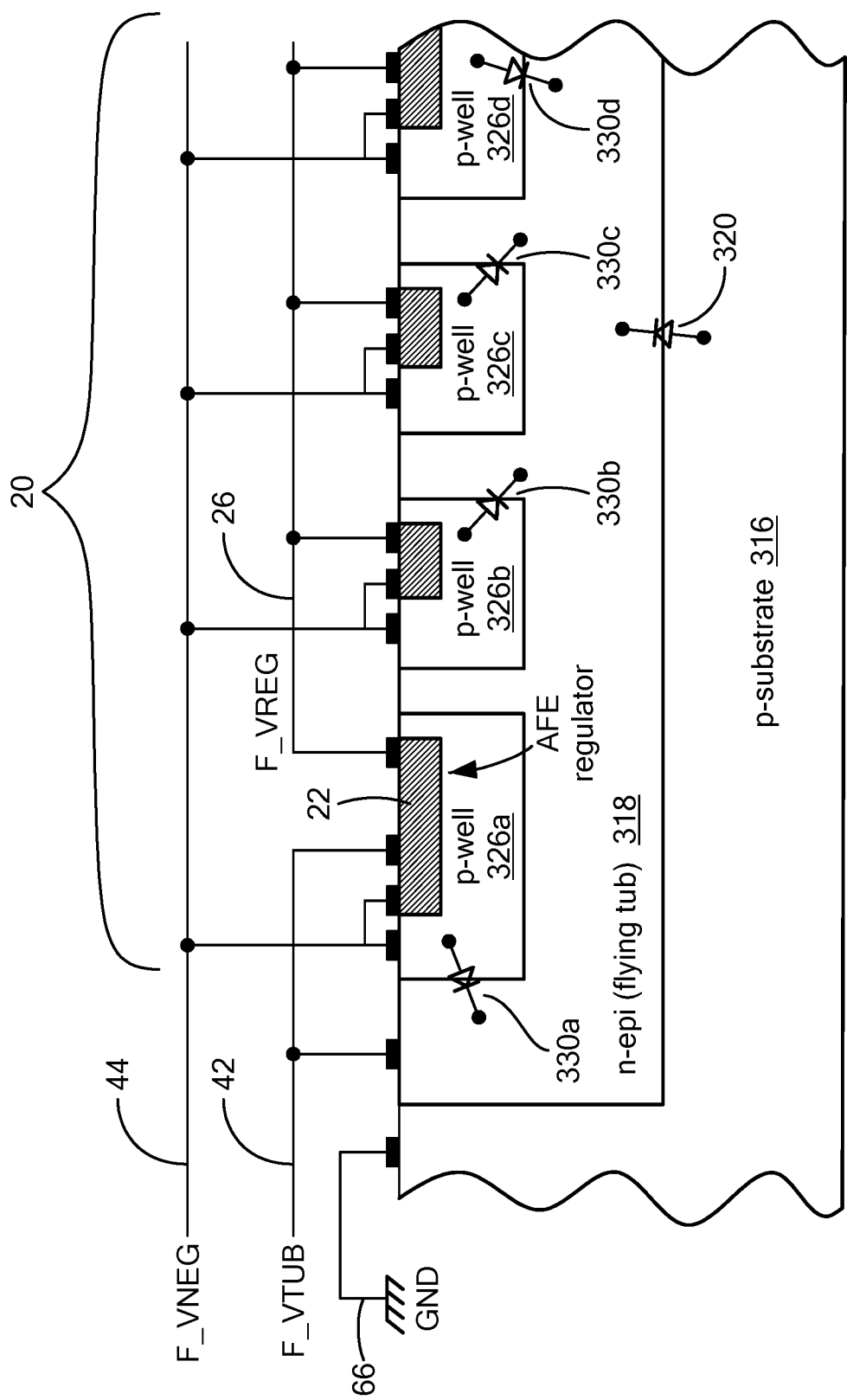
FIG. 3 is a simplified cross-sectional view of the current sensor of FIG. 1.
Figure 5:
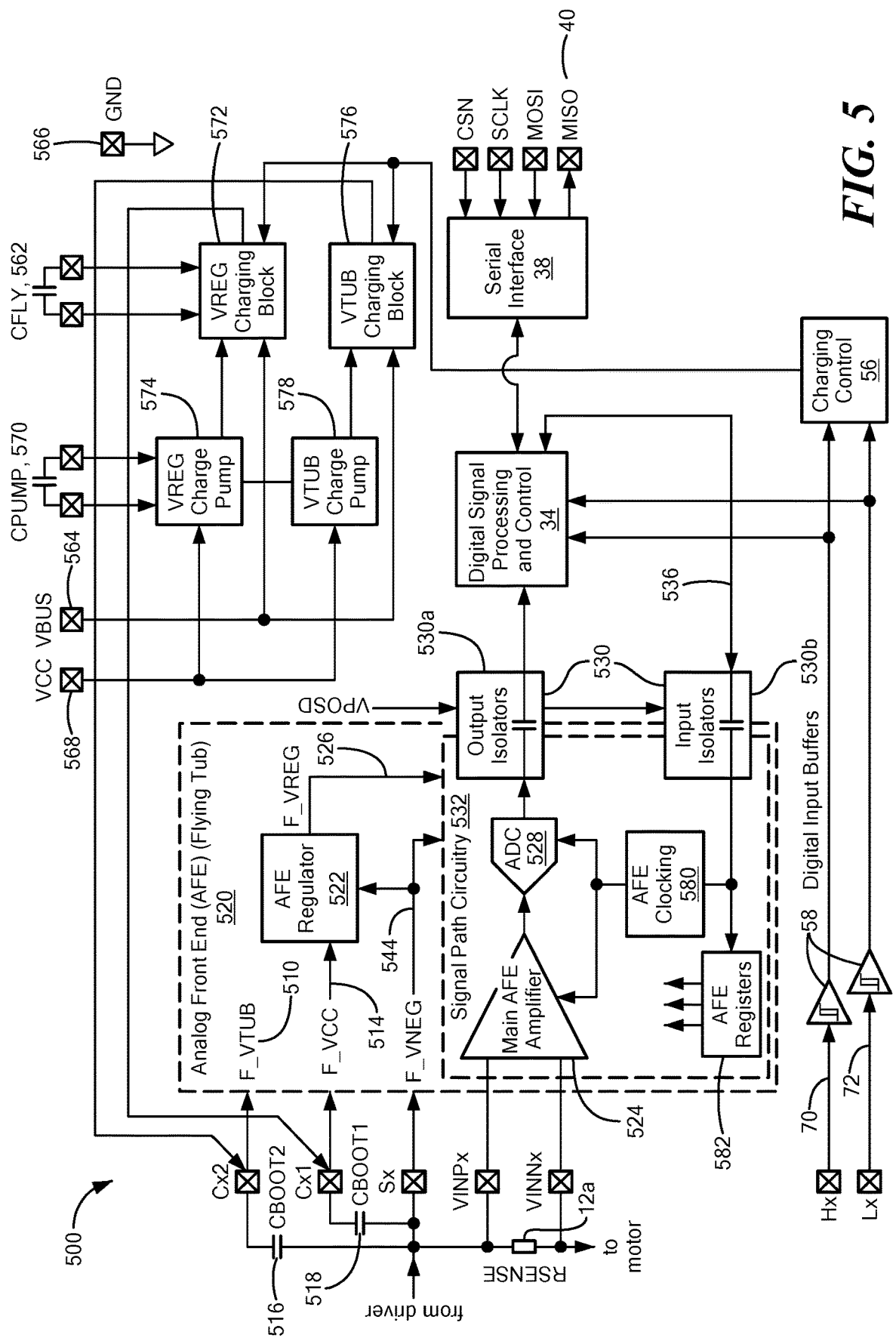
FIG. 5 is a block diagram of a current sensor IC including an analog front end and a tub biased to different voltages.

Referring also to the simplified cross-sectional view of the current sensor IC in FIG. 3, the current sensor IC 10 can include a substrate 316 and a tub 318 disposed in the substrate, with the analog front end 20 disposed in the tub. In the current sensor IC 10 of FIG. 1, both the analog front end 20 and the tub 318 are biased to the bias voltage F_VTUB 42. It will be appreciated that tub 318 need not be a single tub, but rather, can be split into more than one tub which tubs may be biased to the same voltage. In order to provide voltage isolation between the commonly biased analog front end 20 and tub 318 and the low voltage circuitry supported by the substrate, in some embodiments, the bias voltage F_VTUB 42 can be on the order of +15V greater than the common mode voltage Sx in order to prevent forward biasing of the junction 320 between the tub and substrate. In the embodiment of FIG. 5, the analog front end 20 and the tub 318 are biased to different bias voltages as will be explained.

The analog front end circuitry 20 is formed in p-well regions 326a-326d in the tub 318. More particularly, regulator 22 can be formed in p-well region 326a and additional active front end circuitry can be constructed in p-type regions 326b, 326c, 326d, as shown.

The substrate 316 can be a semiconductor substrate or wafer, as may be comprised of a p-type material. The tub 318 can be formed by an epitaxial process and can be an n-type material. It will be appreciated that other processes and/or materials may be possible.

A junction (i.e., a p-n silicon junction) 320 between the substrate 316 and tub 318 is pictorially represented by a diode that forms an isolation barrier (i.e., an open circuit) when the n-side is biased higher than the p-side. Additional p-n junctions 330a, 330b, 330c, 330d are shown between the p-type regions 326a, 326b, 326c, 326d and the tub 318, respectively.

Substrate 316 is coupled to ground 66 (FIG. 1). The tub 318 is coupled to the bias voltage F_VTUB 42 and the regulator 22 is coupled to receive the bias voltage F_VTUB 42 referenced to negative supply voltage F_VNEG 44, as shown. P-well regions 326a-326d are coupled to reference voltage F_VNEG 44 and front end circuitry within p-well regions 326b-326d is coupled to receive the regulated voltage F_VREG 26 referenced to reference voltage F_VNEG 44, as shown.

By biasing the tub 318 to a potential that prevents the junction 320 from becoming forward biased (i.e., to a potential approximately 16V higher than the substrate 316), an isolation barrier between the analog front end 20 and the substrate 316 is achieved even when the voltage at sense resistor 12a is below ground, as is desirable to protect the circuitry within the substrate 316 from the high voltages experienced by the biased tub 318. The tub 318 biased in this manner can be referred to as an isolation tub.

Furthermore, by biasing the p-well regions 326a-326d to reference voltage F_VNEG 44, a reverse bias is provided across their junctions 330a-330d with the n-epi tub 318 that is biased to F_VTUB 42. In this way, another isolation layer or barrier is formed between the analog front end 20 and the substrate 316. More particularly, while the 16V bias F_VTUB 42 is a large enough potential to maintain the isolation at junction 320 during the undershoots that can occur during the commutation of the motor, it may be too large a voltage for many of the devices used in the AFE 20 (e.g., some such devices may have a maximum voltage between terminals of 6.5V or even 3.5V). These lower voltage AFE devices are contained in p-wells 326b, 326c, 326d and thus, see a maximum voltage of F_VREG–F_VNEG.

Referring again to FIG. 1, to generate the bias voltage F_VTUB 42, the current sensor IC 10 can include a charging circuit or block 50, a charge pump 54 that boosts an IC supply voltage VCC 68 to a charge pump voltage VCP, a charge control circuit or block 56, digital buffers 58, a fly capacitor CFLY 62, and a boot capacitor CBOOT 52, all coupled as shown. The bias voltage F_VTUB 42 can be generated across the boot capacitor 52 such that the boot capacitor has a first terminal (at which the bias voltage F_VTUB 42 is provided) coupled to the charging circuit 50 and to the analog front end 20 and tub (at connection Cx) and a second terminal coupled to provide the reference potential F_VNEG 44 to the analog front end and tub (at connection Sx). It will be appreciated that while the charge pump 54 is not shown to be connected to an external capacitor, it is possible that one or more capacitors external to the IC 10 may be necessary depending on the voltage and current demands placed on the generated bias voltage F_VTUB 42 in the particular application.

As will be explained further in connection with FIGS. 4A-4C below, the charging circuit 50 can include switches configured to selectively couple the fly capacitor CFLY 62 to a supply voltage (e.g., charge pump voltage VCP generated by charge pump 54) during a first clock phase and to decouple the fly capacitor 62 from the supply voltage and couple the fly capacitor to the boot capacitor 52 during a second clock phase. In some embodiments, the first clock phase does not overlap with the second clock phase. When the fly capacitor 62 is being charged in the first clock phase, the boot capacitor 52 continues to supply power to the analog front end 20. Thus, the boot capacitor 52 is selected to be large enough to supply power to the analog front end 20 without a large voltage droop between the refresh cycles. With this arrangement, the fly capacitor 62 is charged during the first clock phase and charge is transferred from the fly capacitor 62 to the boot capacitor 52 during the second clock phase.

It will be appreciated that the control signals for controlling the switches of the charging circuit 50 can be generated in various ways. For example, the control signals Hx, Lx can be externally generated, can be user programmable, preset, and/or derived from internal circuitry which monitors the voltage at Sx. In some embodiments, as explained in connection with FIGS. 4-4C, the control signals Hx 70, Lx 72 can be application specific signals selected for use based on the expected common mode voltage Sx. More particularly, and as will become apparent, by using the motor control signals Hx 70, Lx 72 to control the charging circuit 50, charging modes are established based on the common mode voltage, as is desirable in order to maintain the desired voltage across the boot capacitor 52 so as to maximize the resulting common mode voltage rejection.

Figure 4:
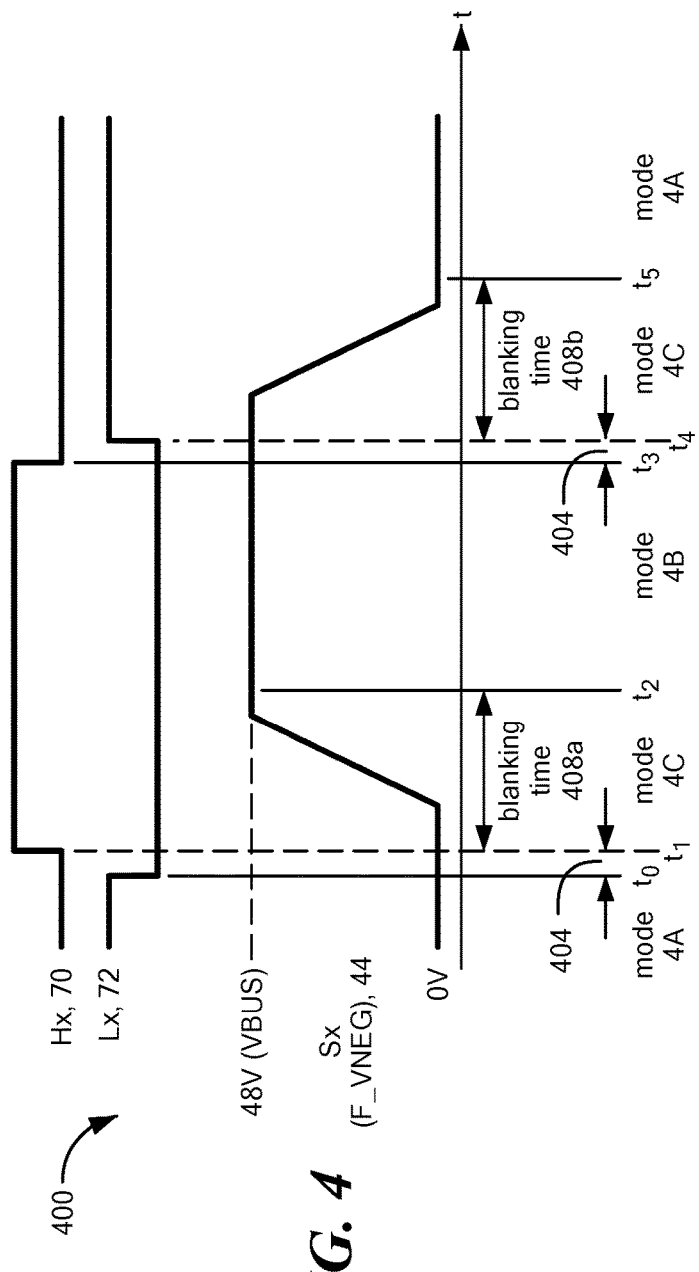
FIG. 4 is a graph showing a common mode voltage waveform in relation to example control signals Lx and Hx associated with the current sensor of FIG. 1.

Referring to FIG. 4, operation of the charging circuit 50 will be explained in connection with example waveforms 400, including an example common mode voltage waveform Sx (which common mode voltage provides the bias reference potential of F_VNEG 44) and control signals Hx 70, Lx 72 by which the common mode voltage Sx is generated. By control of signals Hx 70, Lx 72, motor driver switches (e.g., switches 210, 212 of FIG. 2) cause the voltage at node Sx (e.g., node SA of FIG. 2) to have the relative shape and timing shown by example waveform of the reference voltage F_VNEG 44 in FIG. 4.

Control signals Hx 70, Lx 72 are coupled to the charging control circuit 56 through buffers 58, which charging control circuit 56 generates control signals for switches of the charging circuit 50 based on the state of motor control signals Hx 70, Lx 72. To this end, the charging control circuit 56 can include logic gates for example, in order to generate switch control signals according to the charging scheme explained in connection with FIGS. 4A-4C. Selective opening and closing of switches within the charging circuit 50 cause the fly capacitor 62 and boot capacitor 52 to be coupled in different configurations based on the state of the motor switches (e.g., switches 210, 212 of FIG. 2), which motor switch state is indicated by states of the motor control signals Hx 70, Lx 72.

As is apparent, control signals Hx, Lx are complementary in the sense that when one is high, the other is low and there is dead time 404 when both control signals are low. This is typical of motor driver control signals to ensure that there is no time during which paired high and low side switches are both on (e.g., switches 210, 212 of FIG. 2).

Figure 4A:
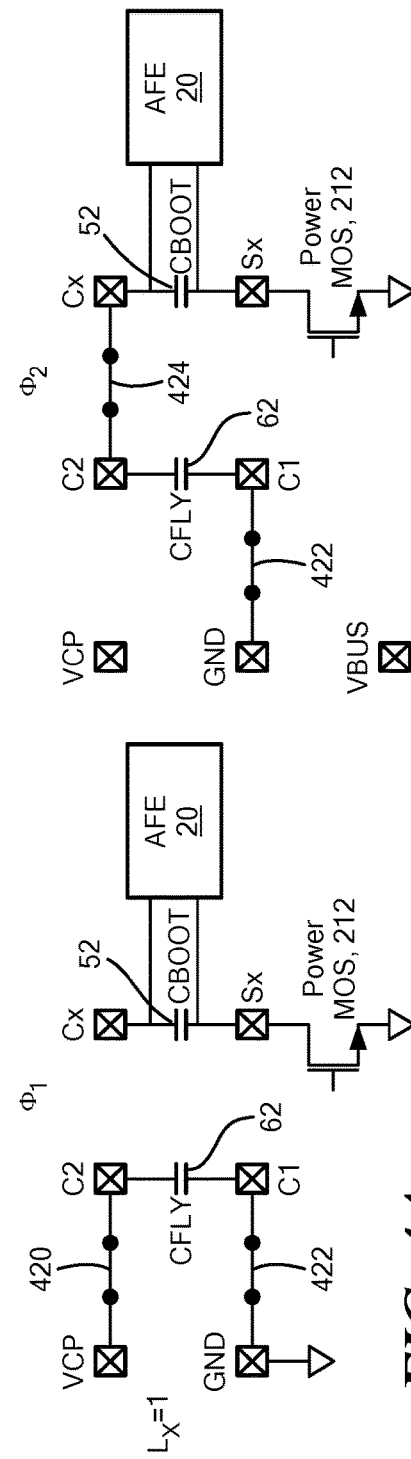
FIG. 4A shows a portion of the current sensor of FIG. 1 when the Lx control signal is high during first and second clock phases.
Figure 4B:
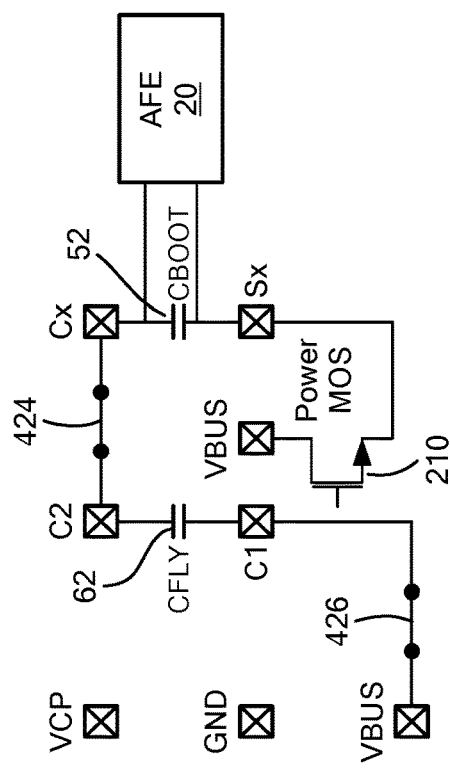
FIG. 4B shows a portion of the current sensor of FIG. 1 when the Hx control signal is high during first and second clock phases.
Figure 4B:
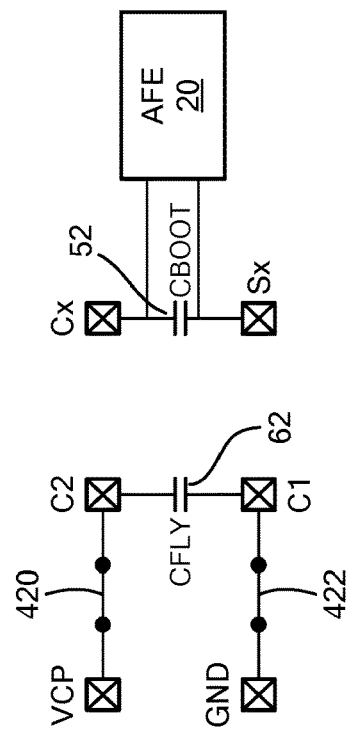
Figure 4C:
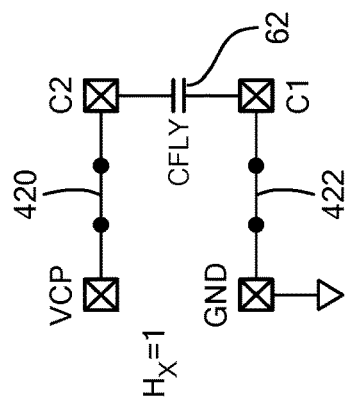
FIG. 4C shows a portion of the current sensor of FIG. 1 when both the Lx and the Hx control signals are low during first and second clock phases.
Figure 4C:
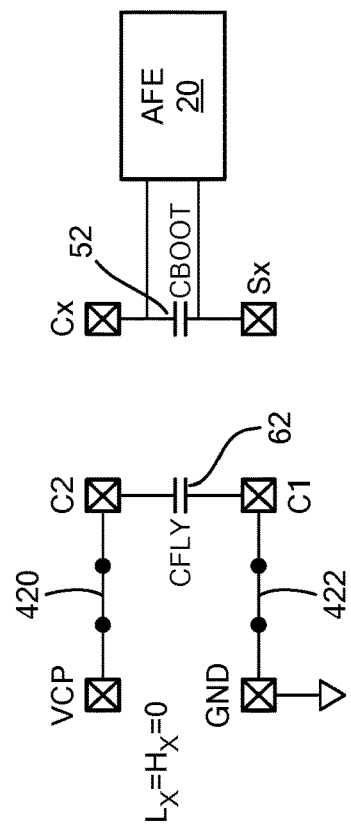

Charging of the boot capacitor 52 can be achieved in three example time periods or charging modes of operation of the charging circuit 50 (here labelled modes 4A, 4B, 4C to reflect that they correspond to the configurations shown in FIGS. 4A, 4B, 4C, respectively) under the control of motor driver control signals Hx 70, Lx 72. Thus, each of FIGS. 4A-4C corresponds to a different mode of the charging circuit 50 and thus, a different corresponding configuration of the switches of the charging circuit 50. As will be apparent, only the closed switches are shown the various views of FIGS. 4A-4C for simplicity of illustration. The left side of each such FIG. 4A-4C corresponds to a first clock phase $\Phi_1$ (i.e., a first portion of a clock cycle) and the right side corresponds to a second clock phase $\Phi_2$ (i.e., a second, different portion of the clock cycle). Clock phases $\Phi_1$ and $\Phi_2$ are non-overlapping, with a dead time to account for delay mismatch.

The charging mode of FIG. 4A corresponds to a time when the Hx control signal 70 is at a logic low level and the Lx control signal 72 is at a logic high level and thus, when the low side driver switch (e.g., switch 212 of FIG. 2) couples the sense resistor 12a to ground (e.g., to ground connection 218 in the context of FIG. 2). Thus, mode 4A can be referred to as low-side charging. During the first clock phase $\Phi_1$ of charging mode 4A (shown on the left side of FIG. 4A), the charging circuit 50 is configured to couple a first terminal of the fly capacitor CFLY 62 to the charge pump voltage VCP and a second terminal of the fly capacitor 62 to ground through closed switches 420, 422, respectively. Also during this first clock phase $\Phi_1$ of the FIG. 4A charging mode, the boot capacitor 52 is coupled to provide the analog front end 20 with the bias voltage F_VTUB 42 referenced to the common mode voltage F_VNEG 44 at connection Sx, as shown. In this configuration, the fly capacitor 62 is charged by VCP and the boot capacitor 52 powers the analog front end 20.

Referring to the second clock phase $\Phi_2$ of charging mode 4A (shown on the right side of FIG. 4A), the charging circuit 50 is now configured to decouple a first terminal of the fly capacitor 62 from the VCP voltage (e.g., by opening switch 420) and instead to couple the first terminal of the fly capacitor 62 to the boot capacitor 52 with a closed switch 424. The second terminal of the fly capacitor 62 remains coupled to ground through switch 422. During this second clock phase $\Phi_2$ of the FIG. 4A charging mode, the boot capacitor 52 remains coupled to provide the analog front end 20 with the bias voltage F_VTUB 42 referenced to the common mode voltage F_VNEG 44 at connection Sx, as shown. In this configuration, the charge on the fly capacitor 62 is transferred to the boot capacitor 52 to refresh the boot capacitor charge and the analog front end 20 remains powered by the boot capacitor 52, as shown.

The charging mode of FIG. 4B corresponds to a time when the Hx control signal 70 is at a high level and the Lx control signal 72 is at a logic low level, and thus, when the high side driver switch (e.g., switch 210 of FIG. 2) couples the sense resistor 12a to the bus voltage VBUS (e.g., to connection 216 in the context of FIG. 2). Thus, mode 4B can be referred to as high-side charging. During the first clock phase $\Phi_1$ of the charging mode of FIG. 4B (shown on the left side of FIG. 4B), the charging circuit 50 is configured to couple a first terminal of the fly capacitor 62 to the VCP voltage and a second terminal of the fly capacitor 62 to ground through switches 420, 422, respectively. Also during this first clock phase $\Phi_1$ of the FIG. 4B charging mode, the boot capacitor 52 is coupled to provide the analog front end 20 with the bias voltage F_VTUB 42 referenced to the common mode voltage F_VNEG 44 at connection Sx, as shown. In this configuration, the fly capacitor 62 is charged by VCP and the boot capacitor 52 powers the analog front end 20.

Referring to the second clock phase $\Phi_2$ of the 4B charging mode (shown on the right side of FIG. 4B), the charging circuit 50 is now configured to decouple the first terminal of the fly capacitor 62 from VCP (e.g., by opening switch 420) and instead to couple the first terminal of the fly capacitor 62 to the boot capacitor 52 with a closed switch 424. The charging circuit 50 is further configured to couple the second terminal of the fly capacitor 62 to the bus voltage VBUS (e.g., connection 64 of FIG. 1 or 216 of FIG. 2) through a closed switch 426. During this second clock phase $\Phi_2$ of the FIG. 4B charging mode, the boot capacitor 52 remains coupled to provide the analog front end 20 with the bias voltage F_VTUB 42 referenced to the common mode voltage F_VNEG 44 at connection Sx, as shown. In this configuration, the charge on the fly capacitor 62 is transferred to the boot capacitor 52 to refresh the boot capacitor charge and the analog front end 20 remains powered by the boot capacitor 52, as shown.

As shown in FIG. 4, a third mode of the charging circuit 50, charging mode 4C, occurs between modes 4A and 4B. Mode 4C can be considered a "standby" mode in which the fly capacitor 62 is not coupled to the boot capacitor 52 to refresh its charge. The purpose of this standby mode 4C is to ensure that during transitions of the motor driver switches 210, 212 (FIG. 2), when Sx is transitioning between at least ground and VBUS or vice versa, the fly capacitor 62 is not coupled to the boot capacitor 52 as is desirable to prevent unknown charging/discharging since the boot capacitor voltage is unknown during this transition time. The omission of a connection from Sx to either VBUS or to ground in FIG. 4C is intended to illustrate that this mode 4C occurs during times of transition between such connections.

More particularly, during the first clock phase $\Phi_1$ of standby mode FIG. 4C (shown on the left side of FIG. 4C), the charging circuit 50 is configured to couple a first terminal of the fly capacitor 62 to the VCP voltage and a second terminal of the fly capacitor 62 to ground in order to thereby charge the fly capacitor. Also during this first clock phase $\Phi_1$ of mode 4C, the boot capacitor 52 is coupled to provide the analog front end 20 with the bias voltage F_VTUB 42 referenced to the common mode voltage F_VNEG 44 at connection Sx, as shown, and is decoupled from the motor driver switches (both the high and low side switches 210, 212, respectively). In this configuration, the fly capacitor 62 is charged by VCP and the boot capacitor 52 powers the analog front end 20.

The second clock phase $\Phi_2$ of mode 4C (shown on the right side of FIG. 4C), is identical to the first clock phase $\Phi_1$ of mode 4C. Thus, the charging circuit 50 remains configured to couple the fly capacitor 62 between VCP and ground 66. Also, the boot capacitor 52 is coupled to provide the analog front end 20 with the bias voltage F_VTUB 42 referenced to the common mode voltage F_VNEG 44 at connection Sx, as shown, and is decoupled from the motor driver switches (both the high and low side switches 210, 212, respectively).

Considering FIG. 4C in connection with FIG. 4, the standby mode includes dead time 404 and a blanking time 408a, 408b. More particularly, when the motor control signal Lx 72 goes low at time t0, mode 4C commences with dead time 404. Once dead time 404 has lapsed at a time labeled t1 with the motor control signal Hx being driven high, a blanking time 408a commences to account for the delay required for the motor driver to drive Sx to its final value. This "blanking time" delay can programmable, including user programmable such as via EEPROM, to permit flexible implementation of the motor driver.

After the blanking time 408a, at a time t2, Sx will have been driven high and it is considered safe to charge the boot capacitor 52 in mode 4B as illustrated by the high-side charging on the right of FIG. 4B.

The standby mode 4C is repeated at the negative transition of Sx. At a time labeled t3, control signal Hx 70 goes low to initiate mode 4C with dead time 404. After the dead time 404 at a time t4, control signal Lx 72 goes high to commence blanking time 408b (which can be the same as or different from the rising edge blanking time 408a). Mode 4A is entered after the blanking time 408b elapses at a time t5 at which point Sx will have been driven low and it is considered safe to charge the boot capacitor 52 as illustrated on the right side of FIG. 4A (low-side charging).

It will be appreciated that it is desirable that the standby mode 4C not be any longer than necessary since during this time, the boot capacitor 52 is powering the analog front end 20 without being refreshed. For example, the Sx signal could have a period on the order of 100 s with a duty cycle ranging from 10% to 90%. The blanking period (mode 4C) can typically last a couple of microseconds.

As will be apparent to those of ordinary skill in the art, with the charging arrangement of FIGS. 4-4C, the boot capacitor 52 is charged in a manner that leverages knowledge of the motor driver connections and thus of the common mode voltage associated with the sensed resistor 12a. With this arrangement of controlling the charging circuit switches based on an indicator of the common mode voltage, the AFE circuitry is properly powered over the entire common mode range.

Referring to FIG. 5 (in which like reference characters refer to like elements of FIG. 1) and according to a further aspect of the disclosure, in connection with a further current sensor IC 500, the analog front end 520 and the tub in which it is formed may be biased to different bias voltages. In particular, in the current sensor IC 500, the analog front end 520 can be biased to a first bias voltage F_VCC 514 that is a first predetermined offset voltage greater than the common mode voltage associated with the resistor 12a (as seen at IC connection Sx) and the tub 318 (FIG. 3) can be biased to a second bias voltage F_VTUB 510 that is a second, different predetermined offset voltage greater than the common mode voltage associated with the resistor (as seen at IC connection Sx).

Elements of the analog front end 520 can include regulator 522 (that can be the same as or similar to regulator 22 of FIG. 1 except for its supply voltage being F_VCC 514 rather than F_VTUB 510) and signal path 532 (that can be the same as or similar to signal path 32 of FIG. 1. Thus, signal path 532 can include amplifier 524, ADC 528, isolators 530 including output isolator 530a and input isolator 530b, clock circuit 580 and registers 582, which elements can be the same as or similar to amplifier 24, ADC 28, isolators 30 including output isolator 30a and input isolator 30b, clock circuit 80 and registers 82 of FIG. 1, respectively. An analog front end (AFE) clock circuit 580 and AFE registers 582 form part of the analog front end 520 and are responsive to a clock signal 536 from the digital processor 34. With this arrangement, the analog front end clock is synchronized with the processor clock. Registers 582 can store configuration bits as may be used for various functions such as trimming a reference voltage.

Generation of the first bias voltage F_VCC 514 can be achieved with a VREG charging circuit 572, a fly capacitor CFLY 562, a VREG charge pump 574, and a charge pump capacitor CPUMP 570, which operate to develop the first bias voltage F_VCC 514 across a first boot capacitor CBOOT1 518, as will be explained. Thus, the first boot capacitor CBOOT1 518 is coupled to the analog front end 520 and more particularly to the regulator 522, as shown. Generation of the second bias voltage F_VTUB 510 can be achieved with a VTUB charging circuit 576 and a VTUB charge pump 578, which operate to develop the second bias voltage F_VTUB 510 across a second boot capacitor CBOOT2 516, as will be explained. Thus, the second boot capacitor CBOOT2 516 is coupled to the tub 318 (FIG. 6) to provide the voltage isolation between the tub and substrate.

In embodiments, the first bias voltage F_VCC 514 is selected to ensure that the regulator 522 is supplied with a voltage and current sufficient to permit regulated voltage F_VREG 526 to be reliably generated for powering the analog front end circuitry and the second bias voltage F_VTUB 510 is selected to ensure that the junction 320 (FIG. 3) between the tub 318 and the substrate 316 does not become forward biased. In general, the first bias voltage F_VCC 514 can provide a higher current and lower voltage bias than the second bias voltage F_VTUB 510 and in one particular example, the first bias voltage F_VCC 514 can be on the order of +5V referenced to the common mode resistor voltage and the second bias voltage F_VTUB 510 can be on the order of +16V referenced to the common mode resistor voltage.

Figure 6:
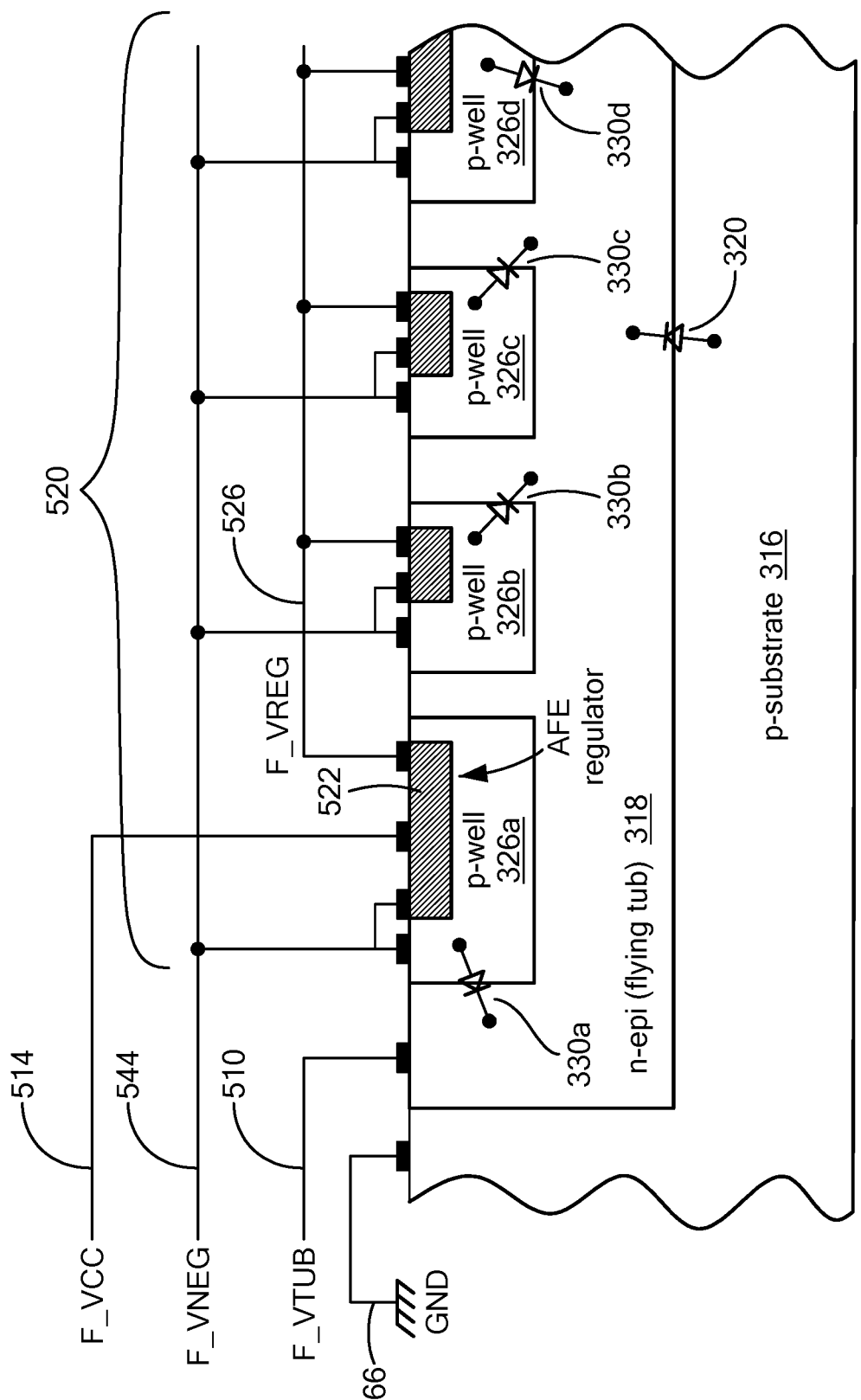
FIG. 6 is a simplified cross-sectional view of the current sensor of FIG. 5.

Referring also to the cross-sectional view of current sensor 500 in FIG. 6, it can be seen that the first bias voltage F_VCC 514 is coupled to the analog front end regulator 522 and the second bias voltage F_VTUB 510 is coupled to the tub 318. This arrangement is in contrast to the current sensor IC of FIG. 1 (as may be referred to as a single bias implementation) in which F_VTUB provides a single bias to both regulator 22 and to the tub 318. In this embodiment, analog front end circuitry within the tub 318 (other than the regulator 522) can be powered by the first bias voltage F_VCC 514 or by the regulated voltage F_VREG 526 as is illustrated. In one particular example, the F_VCC bias voltage 514 can be on the order of 5V and the regulated voltage F_VREG 526 can be on the order of 3.3V.

With this biasing arrangement (as in the case of the biasing of current sensor 10 as shown in FIG. 1), the forward biasing of the junction 320 between the tub 318 and the substrate 316 is prevented as is desirable to protect low voltage circuitry from the high voltages of the flying tub 318. Also, forward biasing of the junctions 330a-330d between the p-well regions 326a-326d and the tub 318 is likewise prevented as is desirable to protect low voltage circuitry from the high voltages of the flying tub 318.

By separating the bias voltages to the analog front end 520 and to the tub 318 in the current sensor IC 500 of FIG. 5, power consumption can be reduced. This is because the analog front end regulator 522 and other circuitry can operate with much lower voltage than is necessary to bias the tub 318 to prevent forward biasing of the junction 320. Separating the bias into a higher voltage tub bias F_VTUB 510 and a lower bias F_VCC 514 allows for lower power dissipation. The tub bias F_VTUB 510 draws very little current, so power dissipation is not a concern with this bias signal.

A further advantage to separating the bias voltages to the analog front end 520 and to the tub 318 in the current sensor IC 500 of FIG. 5 is reduced noise presented to the regulator input at F_VCC 514 and thus also reduced noise on the regulated output F_VREG 526. The isolation tub 318 presents a relatively large capacitive load on the tub bias voltage F_VTUB 510, driven by boot capacitor CBOOT2 516. This capacitance, on the order of 50-100 pF, is formed by the inherent reverse-biased diode capacitance between the isolation tub 318 and the substrate 316. As the common mode voltage experiences rapid changes in voltage (fast transitions on connection Sx), this large capacitance demands large current from the boot capacitor 516, resulting in sharp drops in boot capacitor voltage F_VTUB 510. If this bias voltage F_VTUB 510 powered the regulator 522, then these sharp drops in voltage could be seen at the input of the regulator and could partially or completely pass through to the regulator output. Separating the two bias voltages removes these sharp voltage drops from the regulator input signal and consequently, less power-supply noise is seen by all analog front end circuitry.

Referring again to FIG. 5 and the example manner in which the first and second bias voltages are generated, consider first generating the first bias voltage F_VCC 514. The VREG charging circuit 572 has as its input supply a charge pump voltage provided by VREG charge pump 574. In an example embodiment, the charge pump 574 and CPUMP capacitor 570 operate to increase the VCC voltage 568 (e.g., 5V) to a slightly higher voltage level (e.g., 6.5V) as may be necessary to ensure that the regulator 522 can power analog front end circuitry at start up of the IC 500. The VREG charging circuit 572 can include switches that are selectively opened and closed under the control of control signals Hx 70, Lx 72 in order to charge the fly capacitor CFLY 562 and transfer the charge to the first boot capacitor CBOOT1 518 in the same general manner as explained above in connection with FIGS. 4-4C.

Now considering generating the second bias voltage F_VTUB 510, VTUB charge pump 578 increases the VCC voltage 568 to supply a charge pump voltage to the VTUB charging circuit 576. In the case of the VTUB charge pump 578, there is no separate (e.g., external) capacitor shown as the charge pump capacitor may be internal to the IC 500 in some embodiments. The VREG charge pump 574 is shown coupled an external capacitor CPUMP 570 because of the higher current demand for the first bias voltage F_VCC.

The VTUB charging circuit 576 can include switches that are selectively opened and closed under the control of control signals Hx 70, Lx 72 in order to charge a fly capacitor (not shown, but in the illustrated embodiment such fly capacitor is internal to the charging circuit 576) and transfer the charge to the second boot capacitor CBOOT2 516 in the same general manner as explained above in connection with FIGS. 4-4C.

While the above-described circuitry and techniques are intended to remove glitches from the regulated voltage F_VREG (voltage 26 in FIG. 1 and voltage 526 in FIG. 5) as may otherwise occur when the common mode input voltage Sx changes rapidly, glitches may not be completely removed and can couple to the analog front end (20 of FIG. 1 and 520 of FIG. 5) via the F_VREG voltage. Such glitches can adversely affect the operation of the analog front end circuitry including the amplifier (amplifier 24 of FIGS. 4 and 524 of FIG. 5) and the ADC (ADC 28 of FIG. 1 and 528 of FIG. 5), which may result in current measurements that are adversely affected by the common mode transitions.

According to a further aspect of the disclosure, in embodiments, the clock signal that controls various signal processing operations can be blanked (i.e., held, disabled, or suspended) for periods of time corresponding to times when voltage transients are expected to occur that could adversely affect the signal processing operations. In the example current sensors 10, 500 described herein, the clock signal (e.g., afe_clk signal 36 in FIGS. 1 and 536 in FIG. 5) that controls operations within the analog front end (e.g., 20 of FIG. 1 and 520 of FIG. 5) can be blanked during times when the common mode input voltage Sx changes rapidly.

More generally, example signal processing operations are any operations that respond to a clock signal, including, but not limited to chopping or sampling operations. In the example current sensors 10, 500 described herein, front end signal processing operations that may be controlled by the afe_clk signal 36, 536 include, but are not limited to sampling, chopping, A/D conversion and switched-capacitor signal processing. Sampling may be achieved with a sample-and-hold circuit that may form part of, or be separate from the A/D conversion (e.g., ADC 28 of FIG. 1).

While the afe_clk signal 36, 536 is held, the signal processing operations controlled by the clock signal are not performed. Preventing the occurrence of these signal processing operations during times when the F_VREG voltage is unstable prevents common mode transitions from influencing the sensor operations and performance, such as current measurement in the sensors of FIGS. 1 and 5.

Figure 7:
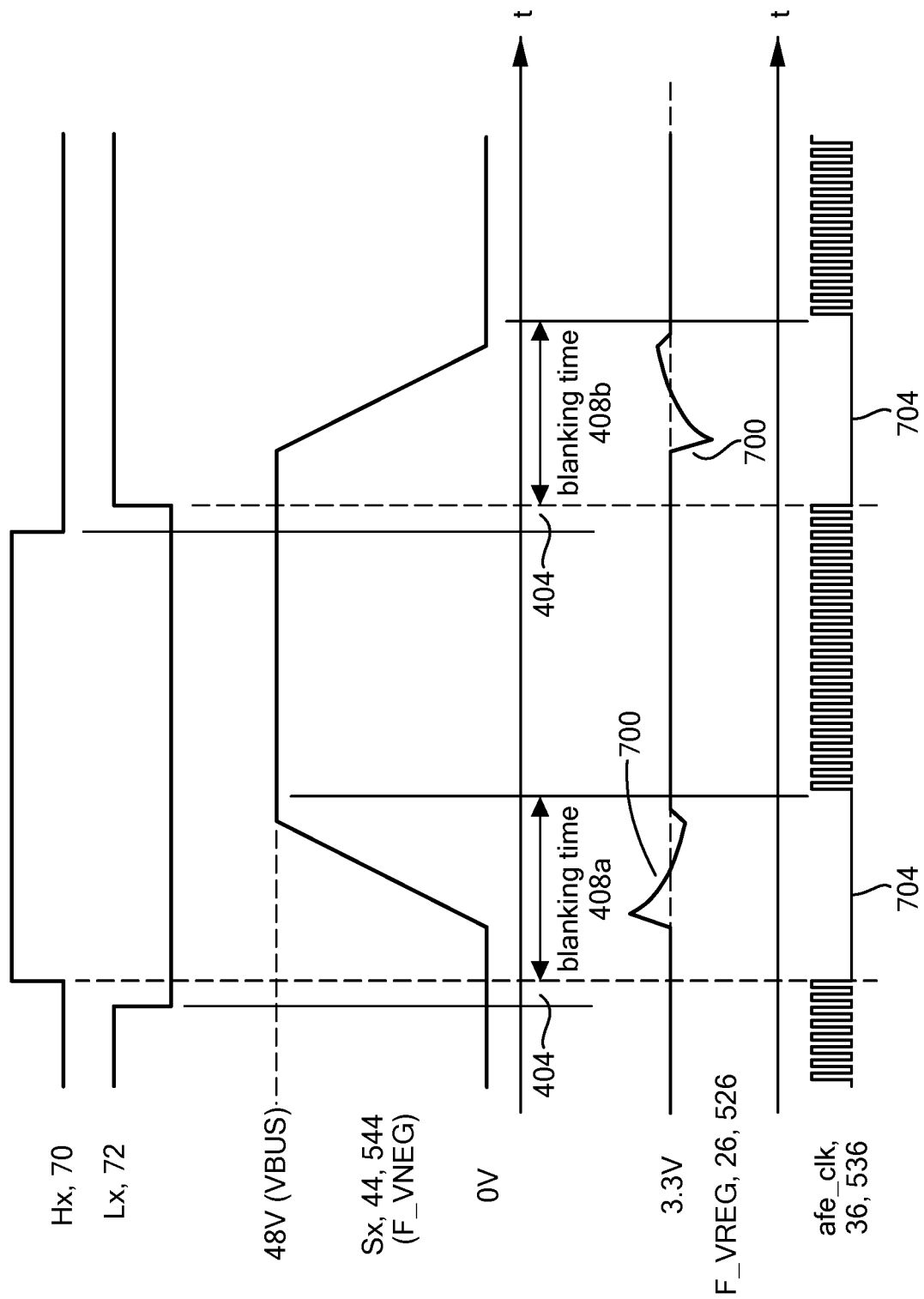
FIG. 7 is a graph showing a common mode voltage waveform in relation to example control signals Lx and Hx, an example F_REG voltage waveform, and an example afe_clk signal associated with the current sensor of FIG. 1 or FIG. 5.

Referring also to FIG. 7, a graph shows an example common mode voltage waveform Sx (F_VNEG at node 44 of FIG. 1 or node 544 of FIG. 5) in relation to example control signals Lx 70 and Hx 72. Also shown in FIG. 7 is an example F_VREG voltage waveform (voltage 26 of FIG. 1 or 526 of FIG. 5) and an example afe_clk signal (36 of FIG. 1 or 536 of FIG. 5) associated with the current sensor of FIG. 1 or FIG. 5. By control of signals Hx 70, Lx 72, motor driver switches (e.g., switches 210, 212 of FIG. 2) cause the voltage at node Sx (e.g., node SA of FIG. 2) to have the relative shape and timing shown by the example waveform of the reference voltage F_VNEG 44, 544 in FIG. 7.

As explained above, charging control circuit 56 generates control signals for switches of the charging circuits (e.g., circuit 50 of FIG. 1) based on the state of motor control signals Hx 70, Lx 72. Thus, the motor switch states can correspond to states of the motor control signals Hx 70, Lx 72.

In embodiments, the blanking times when the afe_clk signal 36, 536 is held can correspond to blanking times 408b in FIG. 4. As explained above in connection with FIGS. 4 and 4C, during a "standby" mode, the fly capacitor 62 is not coupled to the boot capacitor 52 to refresh its charge. The purpose of this standby mode 4C is to ensure that during transitions of the motor driver switches 210, 212 (FIG. 2), when Sx is transitioning between at least ground and VBUS or vice versa, the fly capacitor 62 is not coupled to the boot capacitor 52 as is desirable to prevent unknown charging/discharging since the boot capacitor voltage is unknown during this transition time. As explained above in connection with FIG. 4C, the standby mode includes a dead time 404 and a blanking time 408a, 408b. The blanking time is provided to account for the delay required for the motor driver to drive Sx to its final value. The blanking time 408a, 408b ends once it is considered safe to charge the boot capacitor (e.g., capacitor 52 in mode 4A or 4B). As also noted, it is desirable that the standby mode 4C not be any longer than necessary since during this time, the boot capacitor 52 is powering the analog front end 20 without being refreshed. For example, the Sx signal could have a period on the order of 100 s with a duty cycle ranging from 10% to 90%. The blanking period (mode 4C) can typically last a couple of microseconds.

As is illustrated by the example F_VREG voltage 26, 526 in FIG. 7, glitches 700 can occur during transitions of the Sx waveform 44, 544. In order to prevent such glitches from adversely affecting the analog front end 20, 520, the digital controller 34 can generate the afe_clk signal such that the signal is blanked (i.e., held) during the blanking times 408a, 408b (as labeled 704 on the afe_clk signal 36, 536). During the blanking times 704, the clock signal 36, 536 is held at a constant level (i.e., no edges occur in the clock signal during these times) in order to thereby prevent operation of the analog front end circuitry to which the clock signal is coupled (here, at a logic low level).

The "blanking time" 704 can programmable, including user programmable such as via EEPROM, to permit flexible implementation of the motor driver. Furthermore, in some embodiments, circuitry may be provided to detect glitches 700 and to initiate blanking periods based on such detection (either in addition to or instead of the above-described predictive approach of establishing the blanking times 704 based on expected times of transition of the common mode input voltage Sx based on control signals Hx 70, Lx 72). For example, an edge detector can detect edges of the voltage Sx in order to thereby detect glitches 700 for use in establishing the blanking time 704.

Having described preferred embodiments, it will now become apparent to one of ordinary skill in the art that other embodiments incorporating their concepts may be used. For example, it will be appreciated that components described in connection with the current sensor IC 10 (FIG. 1) and 500 (FIG. 5) can in some instances be external to the IC including, but not limited to the fly capacitors, boot capacitors, charging circuit, charging control circuit, and charge pumps. It will also be appreciated that various circuitry and techniques are possible for generating the described bias voltages, including circuitry external to the IC.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A sensor comprising:
   an analog front end comprising a circuit element responsive to a clock signal; and
   a clock generating circuit configured to generate the clock signal having blanking time periods during which the clock signal is held at a constant level, wherein the circuit element is not operational during the blanking time periods.

2. The sensor of claim 1, wherein the blanking time periods correspond to time periods during which transitions of a common mode input voltage to the sensor are expected to occur.

3. The sensor of claim 1, wherein the sensor comprises a current sensor integrated circuit to sense a current through a resistor and wherein the circuit element comprises an amplifier having inputs coupled across the resistor.

4. The sensor of claim 3, wherein the circuit element of the analog front end comprises a sample-and-hold circuit.

5. The sensor of claim 4, wherein the analog front end further comprises an analog-to-digital converter coupled to an output of the amplifier to generate a digital signal having a value indicative of the current through the resistor.

6. The sensor of claim 5, further comprising an output isolator coupled between the analog-to-digital converter and a digital processor, wherein the digital processor is configured to generate a sensor output signal indicative of the current through the resistor.

7. The sensor of claim 6, further comprising an input isolator coupled between the digital processor and the analog front end and configured to transmit the clock signal from the digital processor to the analog front end for synchronization and use by the analog-to-digital converter.

8. The sensor of claim 3, wherein the current sensor integrated circuit comprises:
a substrate;
a tub disposed in the substrate; and
a charging circuit configured to bias the analog front end and the tub to a bias voltage that is a predetermined offset voltage greater than a common mode voltage associated with the resistor.

9. The current sensor integrated circuit of claim 8, wherein the common mode voltage associated with the resistor is coupled to the analog front end and to the tub as a reference potential.

10. The current sensor integrated circuit of claim 8, wherein the analog front end further comprises a regulator configured to power the amplifier and coupled to receive the bias voltage as a regulator supply input voltage

.

11. A method comprising:
providing a sensor with an analog front end having a circuit element responsive a clock signal; and
generating the clock signal having blanking time periods during which the clock signal is held at a constant level, wherein the circuit element is not operational during the blanking time periods.

12. The method of claim 11, wherein the blanking time periods correspond to time periods during which transitions of a common mode input voltage to the sensor are expected to occur.

13. The method of claim 11, wherein providing the sensor comprises providing a current sensor integrated circuit to sense a current through a resistor and wherein the circuit element comprises an amplifier having inputs coupled across the resistor.

14. The method of claim 13, wherein providing the analog front end further comprises an analog-to-digital converter coupled to an output of the amplifier to generate a digital signal having a value indicative of the current through the resistor.

15. The method of claim 14, further comprising providing an output isolator coupled between the analog-to-digital converter and a digital processor, wherein the digital processor generates a sensor output signal indicative of the current through the resistor.

16. The method of claim 15, further comprising providing an input isolator coupled between the digital processor and the analog front end, wherein the input isolator transmits the clock signal from the digital processor to the analog front end for synchronization and use by the analog-to-digital converter.

17. A sensor comprising:
an analog front end comprising a circuit element responsive to a clock signal; and
means for generating the clock signal having blanking time periods during which the clock signal is held at a constant level, wherein the circuit element is not operational during the blanking time periods.

18. The sensor of claim 17, wherein the blanking time periods correspond to time periods during which transitions of a common mode input voltage to the sensor are expected to occur.

* * * * *